(12) United States Patent
Sanio

(10) Patent No.: US 10,859,991 B2
(45) Date of Patent: Dec. 8, 2020

(54) METHOD AND SYSTEM FOR A UNIVERSAL PROGRAMMABLE VOLTAGE MODULE

(71) Applicant: MOBILE ELECTRONICS INC., London (CA)

(72) Inventor: Aaron Sanio, London (CA)

(73) Assignee: MOBILE ELECTRONICS INC., London (CA)

( * ) Notice: Subject to any disclaimer, the term of this patent is extended or adjusted under 35 U.S.C. 154(b) by 219 days.

(21) Appl. No.: 16/082,641

(22) PCT Filed: Mar. 21, 2017

(86) PCT No.: PCT/CA2017/000064
§ 371 (c)(1),
(2) Date: Sep. 6, 2018

(87) PCT Pub. No.: WO2017/161439
PCT Pub. Date: Sep. 28, 2017

(65) Prior Publication Data
US 2019/0079477 A1    Mar. 14, 2019

Related U.S. Application Data

(60) Provisional application No. 62/310,881, filed on Mar. 21, 2016.

(51) Int. Cl.
*G05B 19/042* (2006.01)
*B60K 17/28* (2006.01)
(Continued)

(52) U.S. Cl.
CPC .......... *G05B 19/042* (2013.01); *B60K 17/28* (2013.01); *G05F 1/10* (2013.01); *H03K 17/693* (2013.01)

(58) Field of Classification Search
CPC ......... G05B 19/042; B60K 17/28; G05F 1/10; H03K 17/693
See application file for complete search history.

(56) References Cited

U.S. PATENT DOCUMENTS 4,107,785 A    8/1978   Seipp
4,168,796 A *  9/1979   Fulks ............... G01R 31/31924
                                                       714/46
(Continued)

FOREIGN PATENT DOCUMENTS

EP    2693421 A1    2/2014

OTHER PUBLICATIONS

ISA/CA, International Search Report and Written Opinion, dated Jul. 4, 2017, re PCT International Patent Application No. PCT/CA2017/000064.
(Continued)

*Primary Examiner* — Tim T Vo
*Assistant Examiner* — Phong H Dang
(74) *Attorney, Agent, or Firm* — Perry + Currier

(57) ABSTRACT

The present invention relates generally to a universal programmable voltage module that activates and deactivates an electrical component based on a programmed voltage or voltage change on a multiplexed input. The universal programmable voltage module may have input circuitry for conditioning the multiplex input for a processor configured to execute instructions from a computer-readable medium; at least one control switch; power conditioning circuitry receiving power from a battery; at least one visual indicator; and switched output circuitry. Methods of operating the universal voltage module in both a momentary and a latched mode are also provided.

19 Claims, 13 Drawing Sheets

(51) Int. Cl.
 *G05F 1/10* (2006.01)
 *H03K 17/693* (2006.01)

(56) References Cited

U.S. PATENT DOCUMENTS

| | | | | |
|---|---|---|---|---|
| 4,172,280 | A * | 10/1979 | Spiesman | G05B 19/0423 |
| | | | | 700/14 |
| 5,726,561 | A | 3/1998 | Ghosh et al. | |
| 6,457,088 | B1 * | 9/2002 | Lauer | G05B 19/0426 |
| | | | | 710/306 |
| 6,536,029 | B1 | 3/2003 | Boggs et al. | |
| 6,651,178 | B1 * | 11/2003 | Voegeli | G06F 1/26 |
| | | | | 713/1 |
| 2002/0119706 | A1 | 8/2002 | Sagues et al. | |
| 2002/0163826 | A1 * | 11/2002 | Devlin | G06F 1/26 |
| | | | | 365/63 |
| 2010/0244804 | A1 | 9/2010 | Zong et al. | |
| 2015/0022240 | A1 * | 1/2015 | Soraoka | G01R 19/16552 |
| | | | | 327/76 |
| 2016/0342492 | A1 * | 11/2016 | Chen | G06F 13/4282 |
| 2017/0331270 | A1 * | 11/2017 | Mattos | H03K 3/02337 |
| 2018/0267587 | A1 * | 9/2018 | Aldous | G06F 1/28 |

OTHER PUBLICATIONS

EPO, Extended European Search Report, dated Oct. 30, 2019, re European Patent Application No. 17769202.7.

* cited by examiner

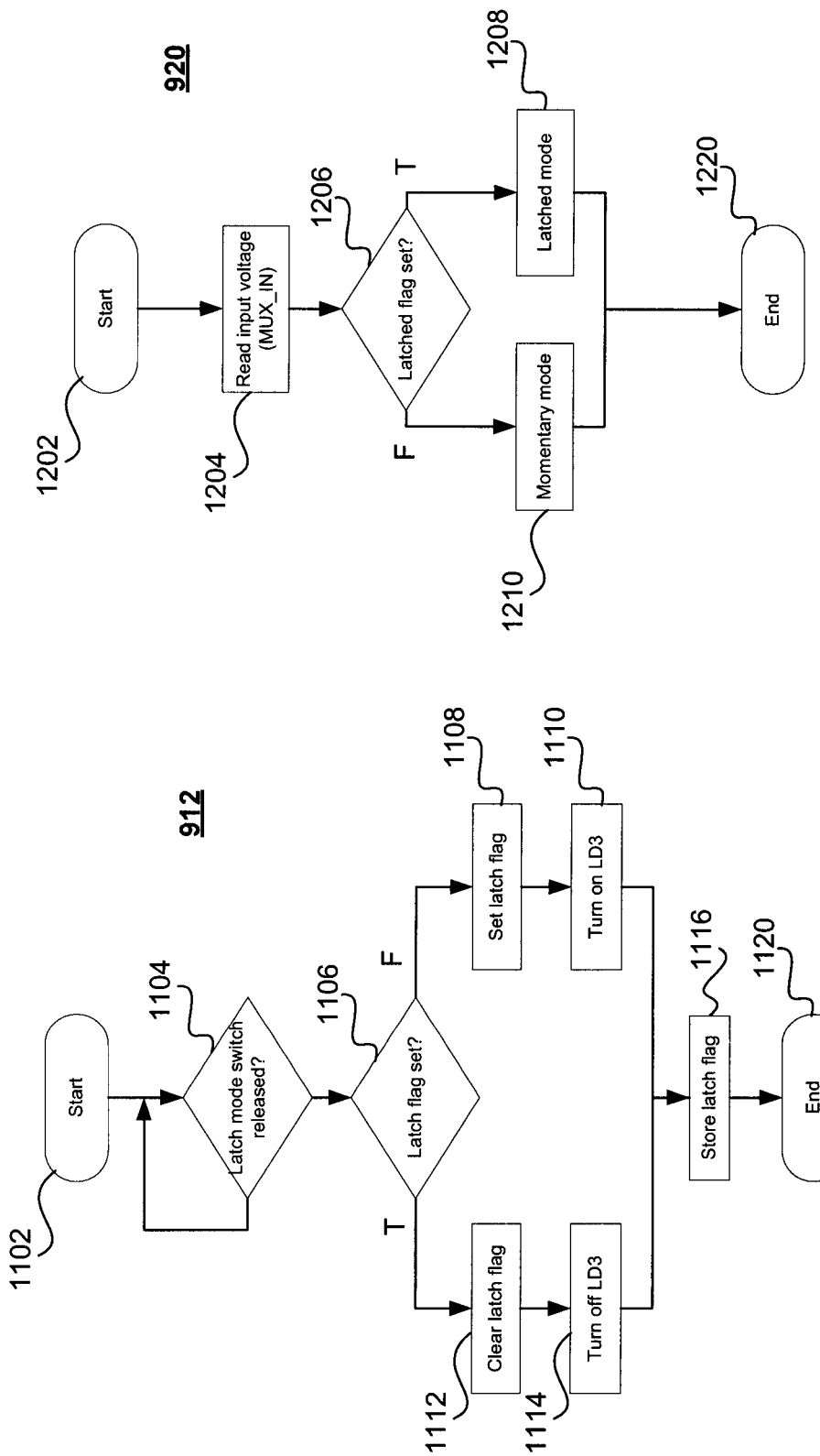

METHOD AND SYSTEM FOR A UNIVERSAL PROGRAMMABLE VOLTAGE MODULE

FIELD OF THE INVENTION

The present invention relates generally to electronic devices, and more particularly to a method and system for a universal programmable voltage module.

BACKGROUND OF THE INVENTION

Multiplexing is a way of connecting and controlling many electrical components efficiently. It was developed to reduce the number of connections required to communicate with each component. It is achieved by sending multiple signals (or commands) across the same wire with a receiver on the other end that determines what that signal means. For example, in automotive systems, many newer Power Take-offs (PTOs) use multiplex circuits to reduce the amount of connections required to control an idle speed, and other necessary changes to engage or disengage a vehicle's PTO. Multiplexing creates a difficulty when trying to use electrical components that monitor the use of devices connected through multiplexed circuits, and when electrical components need to be activated based on events or voltages produced by the multiplexed devices. The reason for the difficulty is that there are multiple functions or events (i.e. voltages) that can occur on a single wire. Customizing an interface for each of the multiplexed devices is difficult and costly. A universal switch may solve these problems; however, universal switches have previously been unable to suitably interface with the multiplex system as they do not react to a specific multiplex signal and ignore other types of multiplex signals.

SUMMARY OF THE INVENTION

In one aspect of the present invention there is provided a universal programmable voltage module, comprising: a processor having non-volatile memory including computer instructions, an analog to digital converter, a plurality of input pins, and a plurality of output pins. The processor is capable of executing the computer instructions for: reading at least one input analog voltage from at least one detected voltage pin of the plurality of input pins, configured as an analog pin; converting the at least one input analog voltage to a voltage value; and comparing the at least one converted voltage value with at least one stored voltage value range. If the at least one input analog voltage is within the at least one stored voltage value range, then asserting at least one output enable pin from the plurality of output pins for activating an electrical component.

In one embodiment, the universal programmable voltage module further comprises at least one voltage select pin from the plurality of output pins.

In another embodiment, the universal programmable voltage module further comprises at least one multiplex input circuit for receiving at least one multiplexed analog voltage and scaling it down for providing the at least one input analog voltage. The at least one multiplex input circuit may comprise a buffer and a resistor divider. The at least one input analog voltage may be provided as an output from a midpoint of the resistor divider. The at least one multiplexed analog voltage may be in a range of 0 volts to 12 volts, and the at least one multiplexed analog voltage may be scaled down by the resistor divider to provide the at least one input analog voltage in a range of 0 volts to 4 volts.

In yet another embodiment, the universal programmable voltage module further comprises a first switch coupled to a first one of the plurality of input pins, the first switch for enabling a programming mode on the universal programmable voltage module.

In another embodiment, the universal programmable voltage module further comprises a second switch coupled to a second one of the plurality of input pins, the second switch for toggling an operating mode of the universal programmable voltage module between a momentary mode and a latched mode.

In a further embodiment, the universal programmable voltage module further comprises a power conditioning circuit for providing a plurality of supply voltages from a direct current power source. The power conditioning circuit may include a voltage measuring output for providing an indication of the voltage of the direct current power source. The voltage measuring output may be connected to a power source voltage detection input pin, configured as an analog pin. The power conditioning circuit may further include at least one of: a 12 volt regulator for providing a 12 volt supply voltage and a 5 volt regulator for providing a 5 volt supply voltage. The power conditioning circuit may further include a direct current to direct current convertor for providing a 15 volt supply voltage from the 5 volt supply voltage.

In yet another embodiment, the universal programmable voltage module further comprises at least one switched output circuit for receiving an output enable signal from the at least one output enable pin. The at least one output enable signal may be applied to an output enable relay that enables a power source voltage to activate the electrical component.

In another embodiment, the universal programmable voltage module may further comprise a at least one output voltage selector circuit for receiving a voltage select signal from the at least one voltage select pin. The voltage select signal may be applied to a voltage select relay that enables selecting a power source voltage to activate the electrical component.

In one embodiment, the at least one input analog voltage comprises a single input analog voltage; the at least one detected voltage pin comprises a single detected voltage pin; the at least one voltage value comprises a single voltage value; the at least one stored voltage value range comprises a single voltage value range; and the at least one output enable pin comprises a single output enable pin.

In another embodiment, the at least one input analog voltage comprises a first input analog voltage and a second input analog voltage; the at least one detected voltage pin comprises a first detected voltage pin and a second detected voltage pin; the at least one voltage value comprises a first voltage value and a second voltage value; the at least one stored voltage value range comprises a first voltage value range and a second voltage value range; comparing the at least one converted voltage value with at least one stored voltage value range comprises comparing the first voltage value with the first voltage range and comparing the second voltage value with the second voltage range; and asserting the at least one output enable pin comprises asserting a first output enable pin and a second output enable pin. Asserting the first output enable pin and the second output enable pin may be based on a configurable switch setting, such as a dual-inline package (DIP) switch.

In yet another embodiment, the at least one input analog voltage comprises a plurality of input analog voltages; the at least one detected voltage pin comprises a plurality of detected voltage pins; the at least one voltage value comprises a plurality of voltage values; the at least one stored voltage value range comprises a plurality of voltage value ranges; comparing the at least one converted voltage value with at least one stored voltage value range comprises comparing the plurality of voltage values with the plurality of voltage ranges; and asserting the at least one output enable pin comprises asserting a plurality of output enable pins. Asserting the plurality of output enable pins may be based on a configurable switch setting, such as a dual-inline package (DIP) switch.

In a further embodiment, the universal programmable voltage module comprises at least one light emitting diode (LED) circuit operatively connected to at least one of the plurality of output pins for indicating an operation mode of the universal programmable voltage module. The at least one LED circuit may comprise a first LED circuit for indicating that the input analog voltage is within the stored voltage value range, a second LED circuit for indicating an operating mode, and a third LED circuit for indicating a programming mode. The operating mode may be a latched mode or a momentary mode.

In another aspect of the present invention, there is provided a telematic device having the universal programmable voltage module described herein.

In another aspect of the present invention, there is provided a method of operating a universal programmable voltage module, comprising: detecting whether the universal programmable voltage module is in a programming mode or in an operation mode; reading an analog input voltage from a detected voltage pin; converting the analog input voltage to a voltage value. If the universal programmable voltage module is in programming mode then: generating a voltage range comprising a minimum voltage threshold and a maximum voltage threshold based on the converted voltage value; storing the voltage range in a non-volatile memory. If the universal programmable voltage module is in operation mode then: retrieving the minimum voltage threshold and the maximum voltage threshold from the non-volatile memory. If the converted voltage value is greater than the minimum voltage threshold and smaller than the maximum voltage threshold then asserting an output enable pin for enabling an electrical component.

In one embodiment, asserting the output enable pin is performed only if the output enable pin was not already asserted.

In another embodiment, if the converted voltage value is less than the minimum voltage threshold or greater than the maximum voltage threshold then de-asserting the output enable pin for disabling the electrical component.

In yet another embodiment, de-asserting the output enable pin is performed only if the output enable pin was not already de-asserted.

In yet another aspect of the present invention there is provided a method of operating a universal programmable voltage module, comprising: detecting whether the universal programmable voltage module is in a programming mode or in an operation mode; reading an analog input voltage from a detected voltage pin; converting the analog input voltage to a voltage value; and if the universal programmable voltage module is in programming mode then: generating a voltage range comprising a minimum voltage threshold and a maximum voltage threshold based on the converted voltage value; storing the voltage range in a non-volatile memory; and if the universal programmable voltage module is in operation mode then: retrieving the minimum voltage threshold and the maximum voltage threshold from the non-volatile memory; if the converted voltage value is greater than the minimum voltage threshold and smaller than the maximum voltage threshold and a previous converted voltage value is less than the minimum voltage threshold or greater than the maximum voltage threshold then asserting an output enable pin if the output pin was de-asserted, and de-assert the output enable pin if the output enable pin was asserted.

BRIEF DESCRIPTION OF THE DRAWINGS

An embodiment will now be described, by way of example only, with reference to the attached Figures, wherein:

FIG. 11 is a flow chart of the latch toggle functionality which is part of the firmware of the UPV module of FIG. 2 executed on the processor of FIG. 3, in accordance with an embodiment of the present invention;

FIG. 12 is high level flow chart of the operation mode of the UPV module of FIG. 2 which is part of the firmware executed on the processor of FIG. 3, in accordance with an embodiment of the present invention;

DETAILED DESCRIPTION OF THE EMBODIMENT

While the Background of Invention described above has identified particular problems known in the prior art, the present invention provides, in part, a new and useful application for determining when a multiplex wire exhibits a particular voltage change and as a result triggers operation of an electrical component.

Figure 1A:
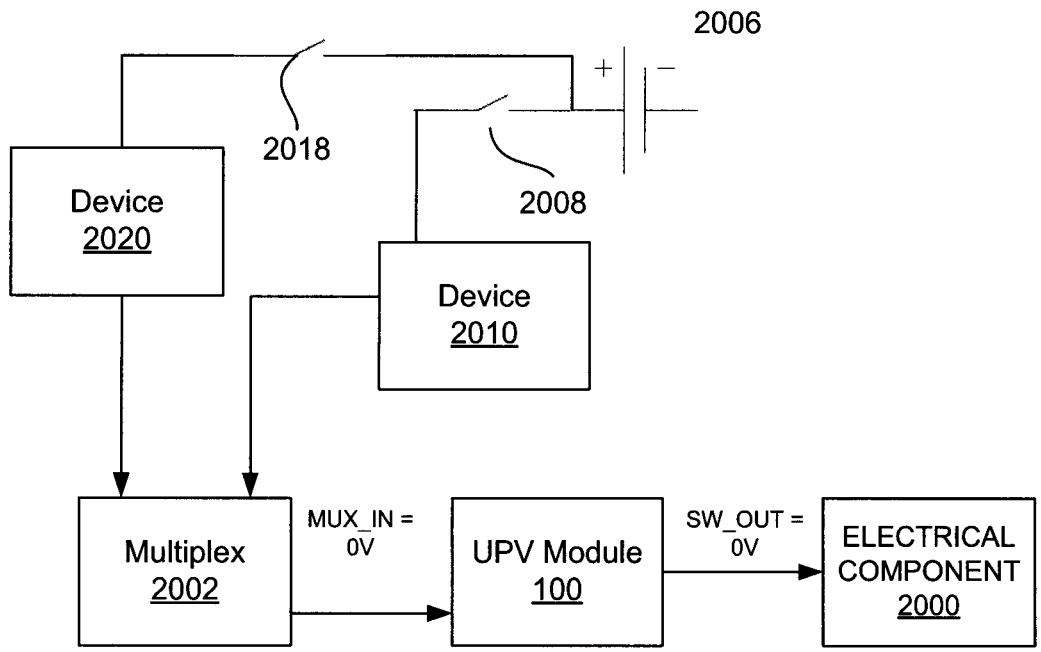
FIG. 1A depicts an exemplary system employing a universal programmable voltage (UPV) module system with two multiplexed devices in a non-operational mode.
Figure 1B:
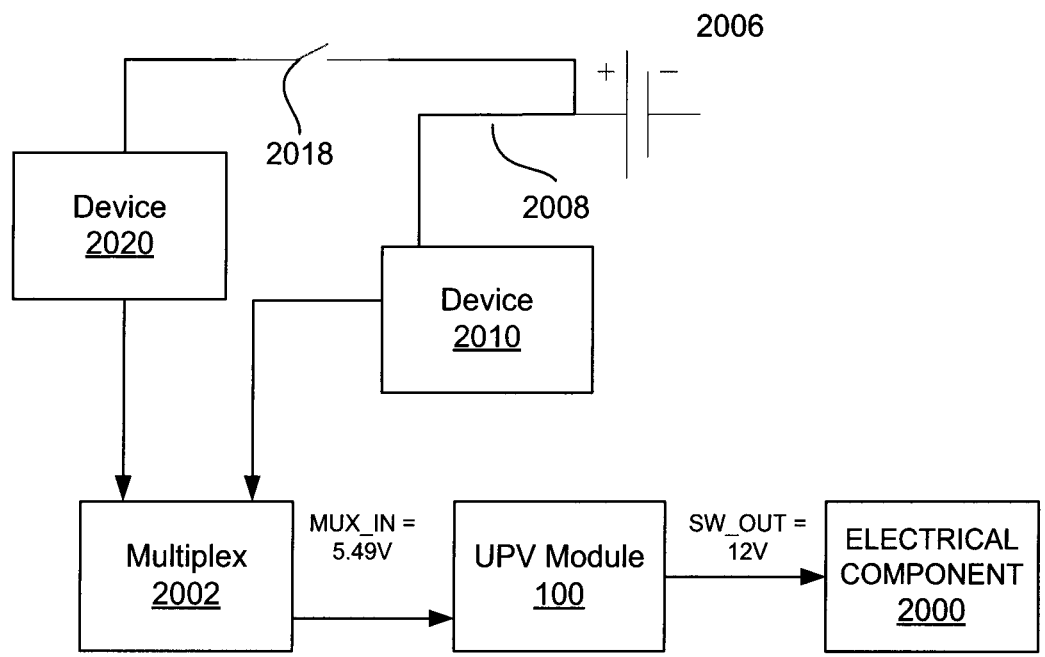
FIG. 1B depicts the exemplary system of FIG. 1A in which one of the multiplexed devices is in operational mode.

With reference to FIG. 1A and FIG. 1B, there is shown an exemplary system employing the universal programmable voltage module (UPV) module 100 with two devices 2010 and 2020 connected via a multiplex module 2002. The exemplary system also comprises a battery 2006, and switches 2008 and 2018 for activating devices 2010 and 2020, respectively. Battery 2006 may be of any suitable voltage. In a typical automotive system, battery 2006 may be a 12V or a 24V battery. Devices 2010 and 2020 may be any device in an automotive system, such as a power take off (PTO), a salt spreader, an agricultural sprayer, a 4×4 transfer case position, a snow plow, an outrigger, a siren, a light bar, a seat belt, a boom truck, or a side loader on a waste disposal vehicle. Electrical component 2000 may be a telematic device having wireless capability to send information to a remote peer. However, device 2000 may also be a radio, a light, a nitrous oxide system actuator, an exhaust dump, or any other electrical component that is triggered by an analog signal. Device 2010 may generate a particular voltage pulse of a specific value to indicate a particular event. For example, a particular analog voltage may indicate that a driver side window has been opened in a car. This may be a peculiar value such as 5.5 volts, for example. It may be desired to activate an electrical component 2000 when device 2010 has produced a particular voltage. However, electrical component 2000 typically expects specific voltage levels, such as 12V. Accordingly, the output of multiplex module 2002 which is labeled MUX_IN is fed to UPV module 100 which is programmed to recognize a particular voltage level, provided by device 2010 that needs to be detected. UPV module 100 then produces an output that is compatible with electrical component 2000, which is denoted SW_OUT or switched output and may either be 12 volts or a ground signal. The electrical component 2000 in turn, is activated. The electrical component 2000 may additionally record the event, or report the event to a remote peer.

FIG. 1A shows the exemplary system with both devices 2010 and 2020 disconnected or non operational. This is exemplified by the fact that both switches 2008 and 2018 are in open mode and therefore battery 2006 is not powering any of the devices. Switch 2008 may be a push button or any type of switch that activates device module 2010 by connecting it to battery 2006. Similarly, switch 2018 may be a push button or any type of switch that activates device module 2020 by connecting it to battery 2006. For example switch 2008 may be a push button for turning on the radio in car, or locking a driver side door, etc. When switch 2008 is open, the MUX_IN signal produced by multiplex 2002 may be 0V. However, in other examples, the MUX_IN signal may have another value other than 0V when switch 2008 is open, as per the example below. Accordingly, UPV module 100 produces an output SW_OUT of 0V. The electrical component 2000 is not activated. If, for example, electrical component 2000 is a telematic device, then no data is transmitted.

FIG. 1B shows the exemplary system with switch 2008 in closed mode and accordingly device module 2010 is operational. An exemplary voltage of 5.49V is shown as the value of the signal MUX_IN. If UPV module 100 was programmed to detect voltages in the range of 3.4V to 6.6V, then the voltage of 5.49 is detected. Upon detecting the signal, UPV module 100 outputs a signal SW_OUT which in this case is shown as 12V to electrical component 2000. This causes electrical component 2000 to be activated in response to the event corresponding to that voltage (5.49V). If electrical component 2000, for example, is a telematic device, then an event corresponding to that voltage range is reported to a remote peer. If, however, switch 2008 was open and 2018 was closed (not shown), and assuming device 2020 generates a voltage of 2.5V, the signal MUX_IN would be 2.5V. Since UPV module 100 was programmed to detect voltages in the range of 3.4V to 6.6V, the UPV module outputs a signal SW_OUT at 0V and the electrical component 2000 is not activated. As such, the UPV module can distinguish between multiple events represented by different voltages multiplexed on the same wire.

Figure 2:
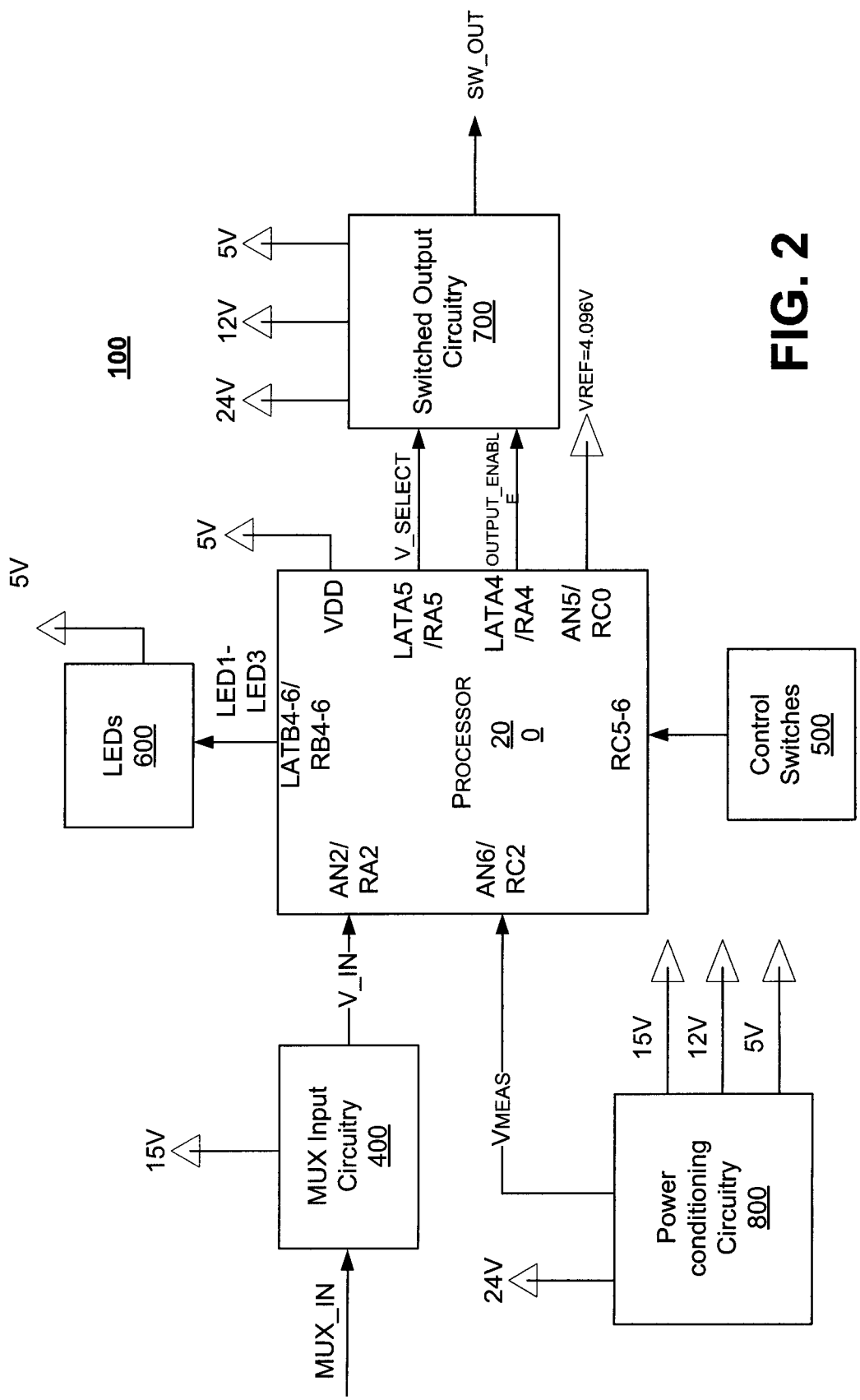
FIG. 2 shows a high-level architecture of a UPV module in accordance with an embodiment of the present invention.
Figure 3:
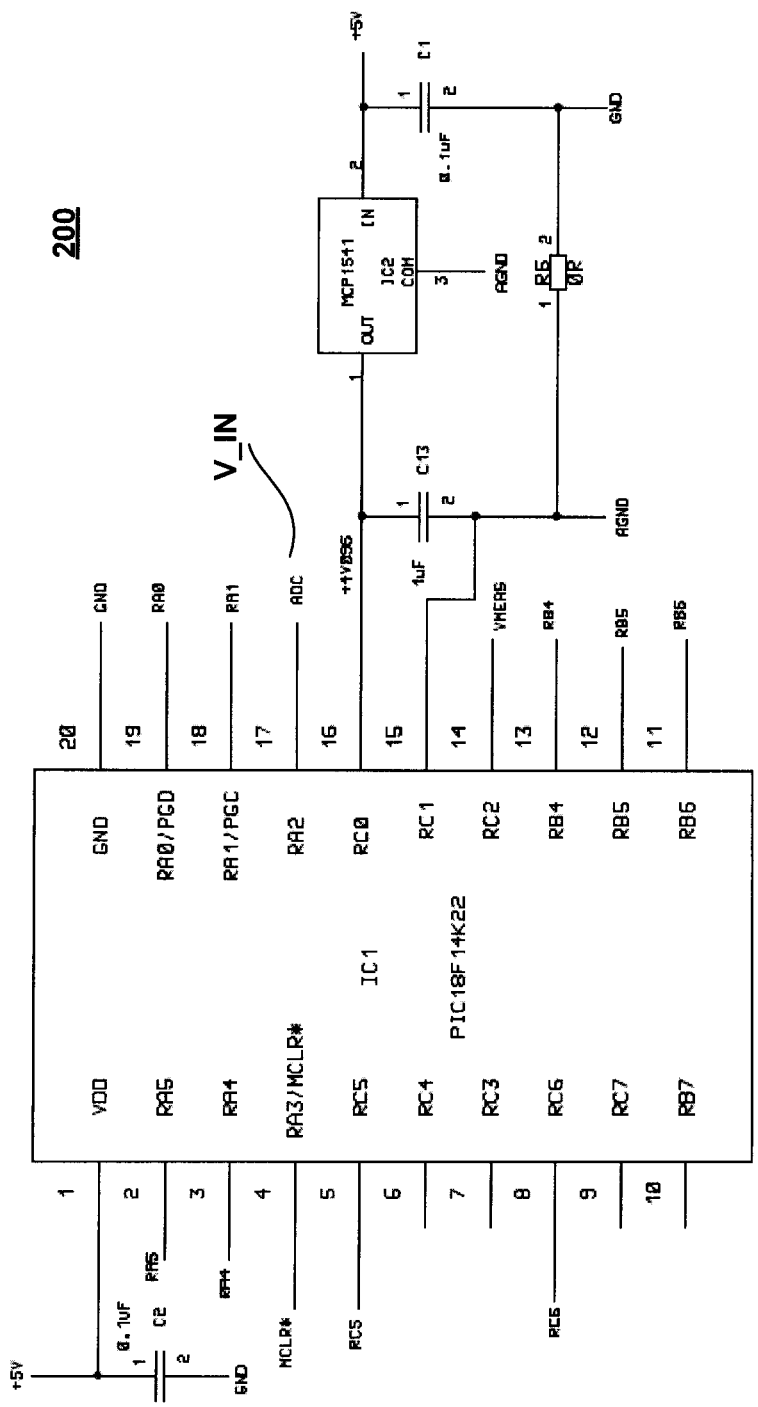
FIG. 3 is a schematic diagram of a processor of the UPV module of FIG. 2, in accordance with an embodiment of the present invention.

Turning now to a more detailed description of the elements, FIG. 2 shows a high-level architecture of a UPV module 100 in accordance with an embodiment of the present invention. The UPV module 100 is comprised of a number of components such as multiplex (MUX) input circuitry 400, power conditioning circuitry 800, control switches 500, LEDs 600, and switched output circuitry 700. However, at the heart of the UPV module 100 is a microprocessor (or processor, or microcontroller) 200 which, in this embodiment, is a Microchip PIC18F14K22 microcontroller. The processor 200 comprises a 12 MHz crystal XT1 that sets the operating frequency of the processor 200 at 4 MHz. An external voltage reference IC2 (MCP1541) is used to provide a reference voltage of 4.096V. The reference voltage is provided to the processor at analog input 5 (AN5) which is on pin RC0. Other microcontrollers may also be used. The processor 200 reads and executes computer readable instructions from memory therein. Alternatively, the memory may be a separate memory module with which the microprocessor 200 interfaces. The instructions are further described with reference to FIGS. 9 to 14 below. The processor 200 interfaces with other components of the system as described herein.

Figure 8A:
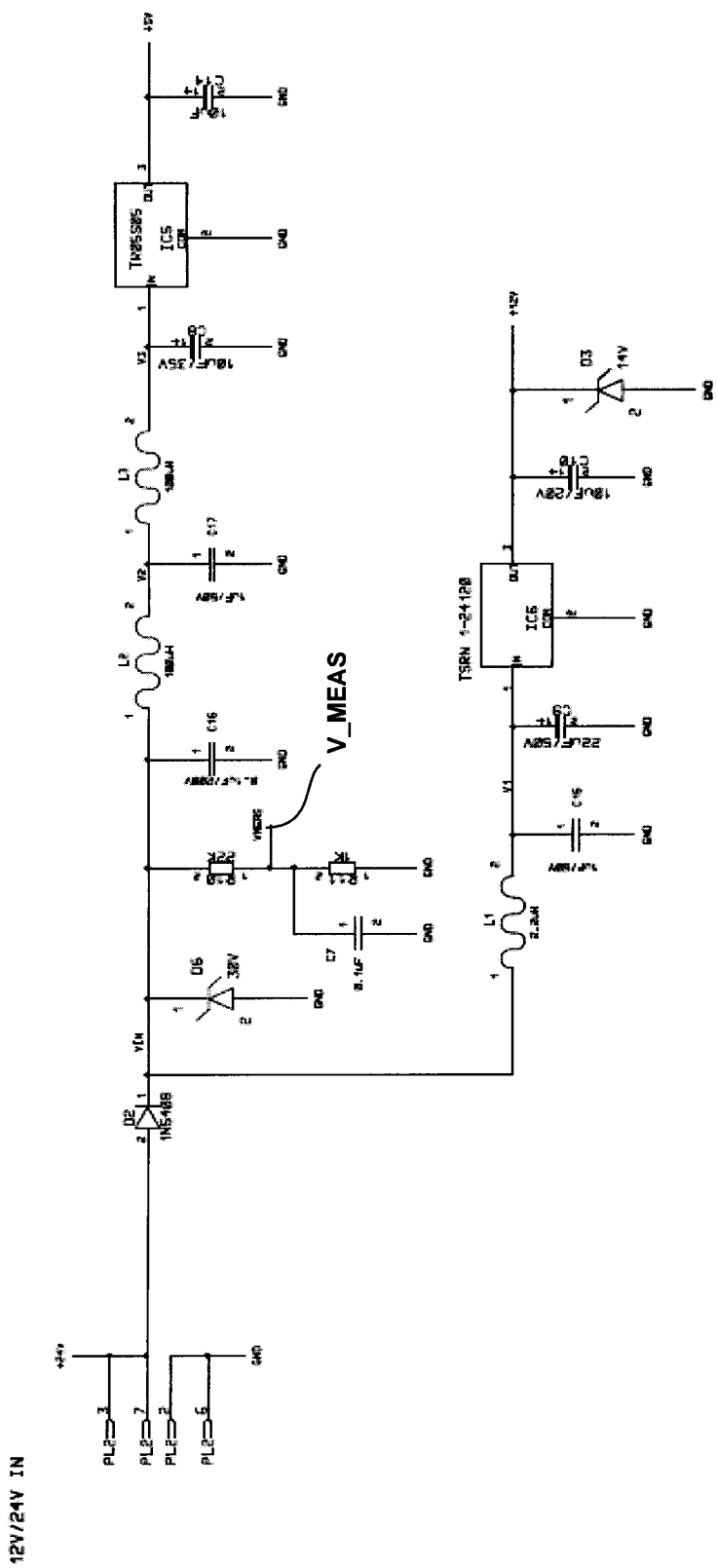
FIGS. 8A and 8B are schematic diagrams of power conditioning circuitry of the UPV module of FIG. 2, in accordance with an embodiment of the present invention.
Figure 8B:
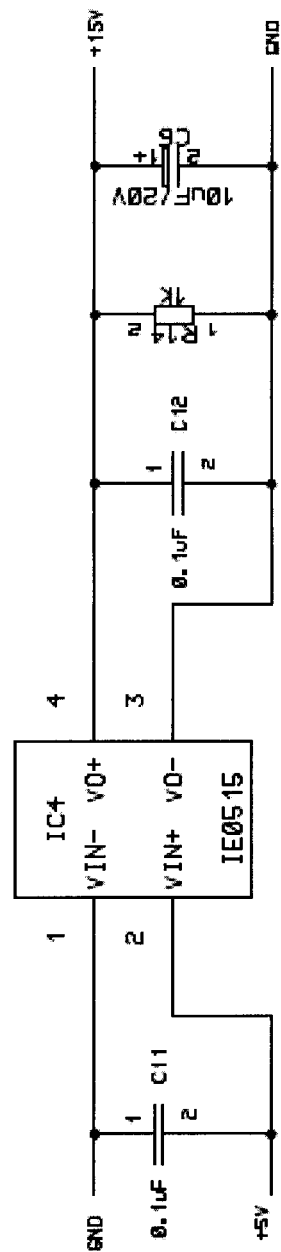

As seen in FIG. 2, the various components of the system are powered using 5V, 12V, and 15V power supplies. An automotive electrical system is typically powered off of a 12V or a 24V battery, but other direct current (DC) power sources are also possible. The power conditioning circuitry 800, shown in more detail with respect to FIGS. 8A and 8B provide 5V, 12V, and 15V from a 12V (not shown) or 24V supply, such as a car battery. The battery voltage is passed through a general-purpose rectifier D2 (1N5408) to produce VIN which is used to power two parallel circuits—one to generate a +5V output and another to generate a +12V output. Both the +5V and +12V paths comprise capacitors and inductors in order to filter out sporadic signals. On the +12V path a DC/DC converter IC5 (TSRN 1-24120) is used to regulate the input voltage (ranging from 7V to 24V) into +12V. On the +5V generation circuit, the processor 200 determines the voltage of the supply battery by measuring the voltage measuring output V_MEAS provided at the midpoint of a resistor divider (R10 and R11) using the onboard analog-to-digital converter (ADC). If the signal V_MEAS is less than 18V, a 12V power supply or battery is assumed, otherwise a 24V power supply or battery is assumed. As is seen in FIG. 2, the V_MEAS signal is connected to the analog channel AN6 (which is on power source voltage detection input pin RC2) of processor 200. Similar to the +12V path, the +5V path comprises a DC/DC converter IC6 (TR05S05) to produce a regulated +5V output. The +5V output is then used in the circuit depicted in FIG. 8B, which uses another DC/DC converter IC4 (IE0515) to produce an output of +15V. Accordingly, the function of the power conditioning circuitry 800 is to provide supply voltage to all other components of the system, and to provide, to processor 200, a voltage value indicative as to whether a 12V or a 24V battery is used to power the system.

Figure 4:
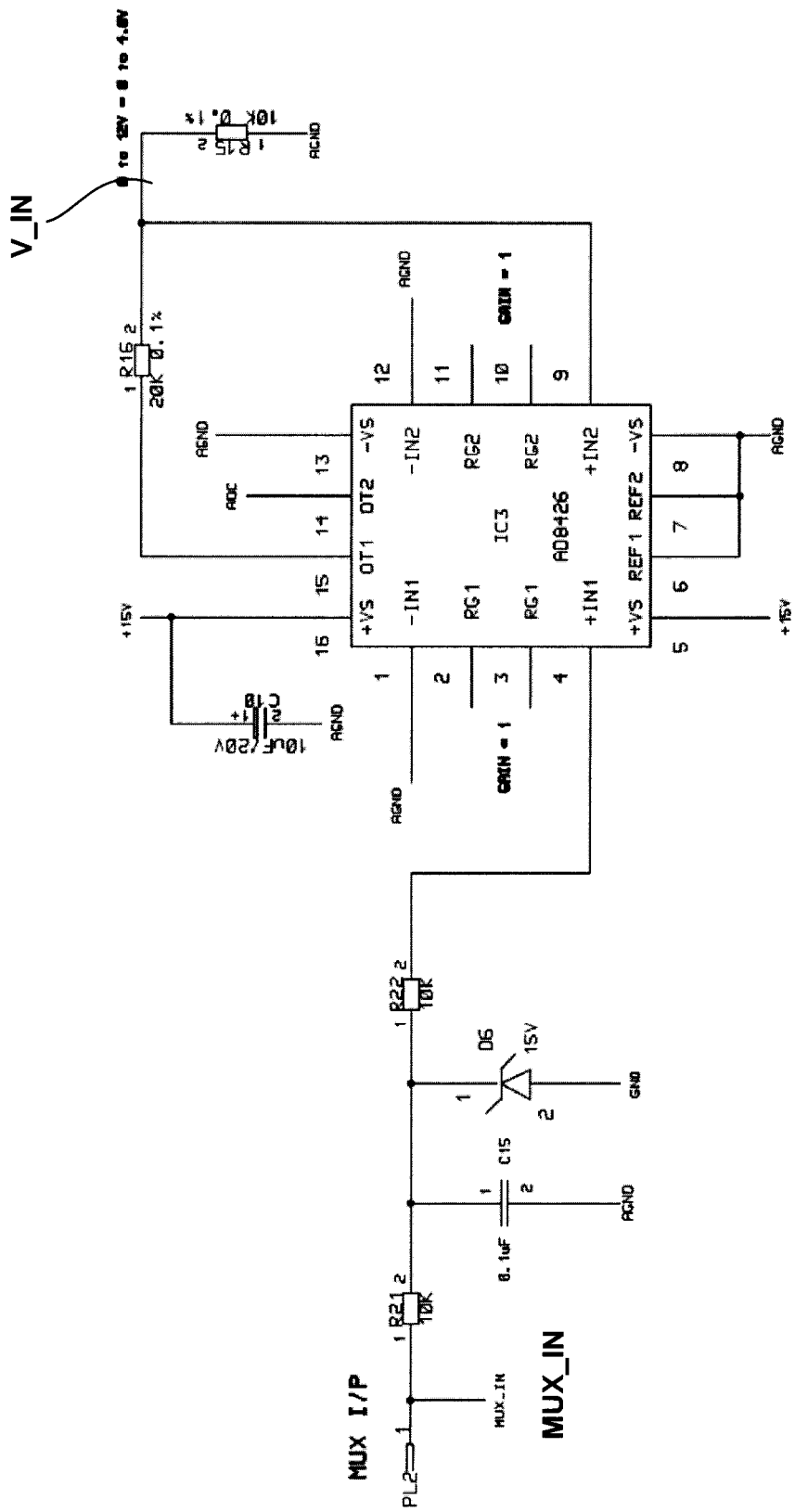
FIG. 4 is a schematic diagram of multiplexer input circuitry of the UPV module of FIG. 2, in accordance with an embodiment of the present invention.

FIG. 4 is a schematic diagram for the MUX input circuitry 400. The MUX_IN signal described with reference to FIGS. 1A and 1B is first input to the MUX input circuitry 400 where it is scaled down 3:1 to provide signal V_IN which is in the range of 0V to 4V. The scaled down signal V_IN is applied as an input analog voltage to the second ADC channel AN2 (which is on pin RA2) on processor 200. The processor may either store that signal level if the system is running in programming mode wherein a certain voltage value is provided to the system for future detection, or may compare that signal with a previously stored signal level matching a particular event to be detected and reported. The signal MUX_IN is applied to pin 1 of PL2 and first passes through an RC filter comprised of resistor R9 and capacitor C5, a 14V Zener diode D1, and a 10K resistor R5 before being input at the positive input of an operational amplifier in IC3 (AD8426). The operational amplifier is configured as a buffer. The buffer output passes to a resistor divider R8 (20K) and R7 (10K) with the output taken between the 10K resistor and ground thus scaling the output from 0 to 12V down to 0V to 4V. The scaled down signal V_IN is then applied to AN2/RA2 as described earlier.

The UPV module 100 runs in a number of modes. In "program" (or "programming") mode, the module is learning the value of the voltage that needs to be detected at a later time. The voltage is provided at the input MUX_IN, programming mode is activated and the processor reads and stores the value in a non-volatile memory. As an example, processor 200 may be provided with an internal EEPROM, or flash memory which is capable of storing data values. In "operation" mode, the system is comparing the voltage provided at MUX_IN with a previously stored voltage to determine whether an event has occurred. Within the operation mode, there is a latched mode in which the system detects changes in voltage from a prior state, and there is a momentary mode in which the system detects a voltage level without regard to a prior state. Momentary and latched modes are described in more detail with reference to FIGS. 13 and 14.

Figure 5:
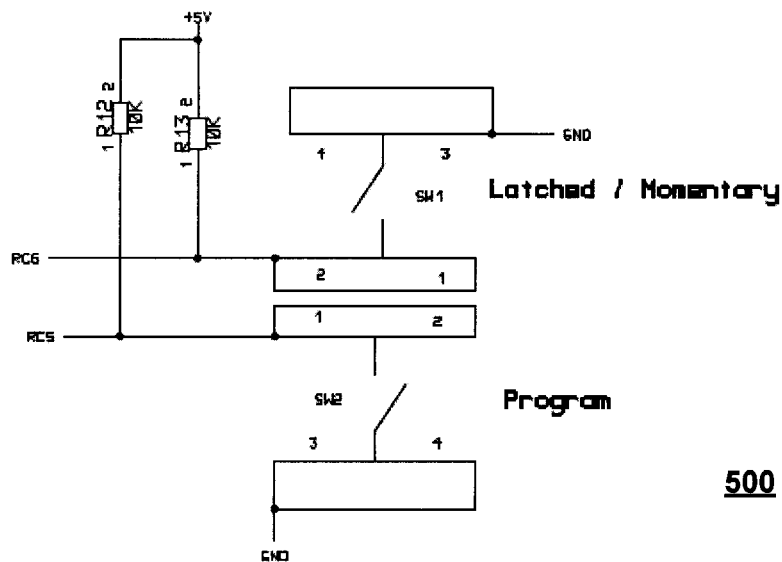
FIG. 5 is a schematic diagram of a switch system of the UPV module of FIG. 2, in accordance with an embodiment of the present invention.

With reference to FIG. 5, switch system 500 is shown in detail. Two switches SW1 and SW2 are provided. SW2 enables programming mode when closed. Otherwise the system is in operation mode. When in operation mode, SW1 may be used to toggle latched mode on and off. The output of switch system 500 is two lines connected to input pins RC5 and RC6 on processor 200. Accordingly, the instructions executing on processor 200 can determine the mode of operation of the system and act accordingly. SW1 and SW2 may be push buttons, or any other equivalent type of electrical switch. When either is pushed the voltage on corresponding pin RC5 or RC6 drops to logic level "0". This is detected by the processor executing the main loop of the firmware. When a button is not pressed the corresponding voltage on pins RC5 or RC6 is logic level "1" which is also detected by the processor 200 when running the main loop of the firmware. In the presented embodiment, SW1 is connected to RC6 and SW2 is connected to RC5.

Figure 6:
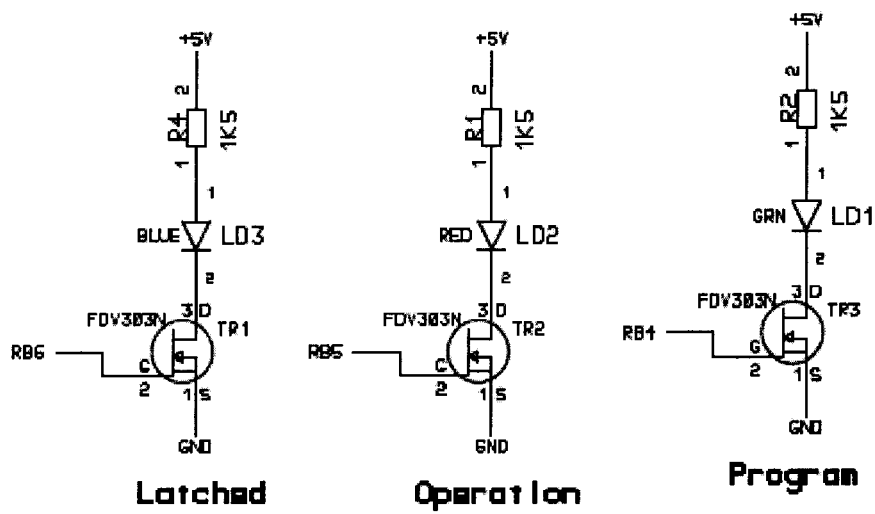
FIG. 6 is a schematic diagrams of a light emitting diode (LED) system of indicators of the UPV module of FIG. 2, in accordance with an embodiment of the present invention.

When a particular mode is selected, via switches SW1 and SW2, a corresponding LED is triggered to indicate that mode. LED system 600 may be provided with 3 LEDs in the described embodiment. The three LEDs of LED system 600 are shown in more detail with reference to FIG. 6. An LED LD1 indicates when the system is in programming (program) mode, in which a voltage provided at MUX_IN is detected and stored in non-volatile memory. LED LD2 indicates normal operation and that the voltage provided at MUX_IN matches a pre-stored voltage range, therefore the output signal SW_OUT is enabled. At any given time LD1 and LD2 cannot be on simultaneously since programming mode and operation mode are mutually exclusive. LD3 indicates whether the system is in latched mode or not. Latched mode is explained in detail with reference to FIG. 14. LD1, LD2 and LD3 are powered by processor 200 using RB4, RB5, and RB6 which are general purpose output port pins. The output signal from RB4 is applied to the gate of TR1 and thus enables TR1 when it is asserted by processor 200. Accordingly current flows through R2 and LD1 so LD1 lights up. Similarly, RB5 and RB6 are applied to the gates of transistors TR2, and TR3, respectively. By the same method, LD2 and LD3 light when RB5 and RB6, respectively, are asserted by processor 200.

Figure 7:
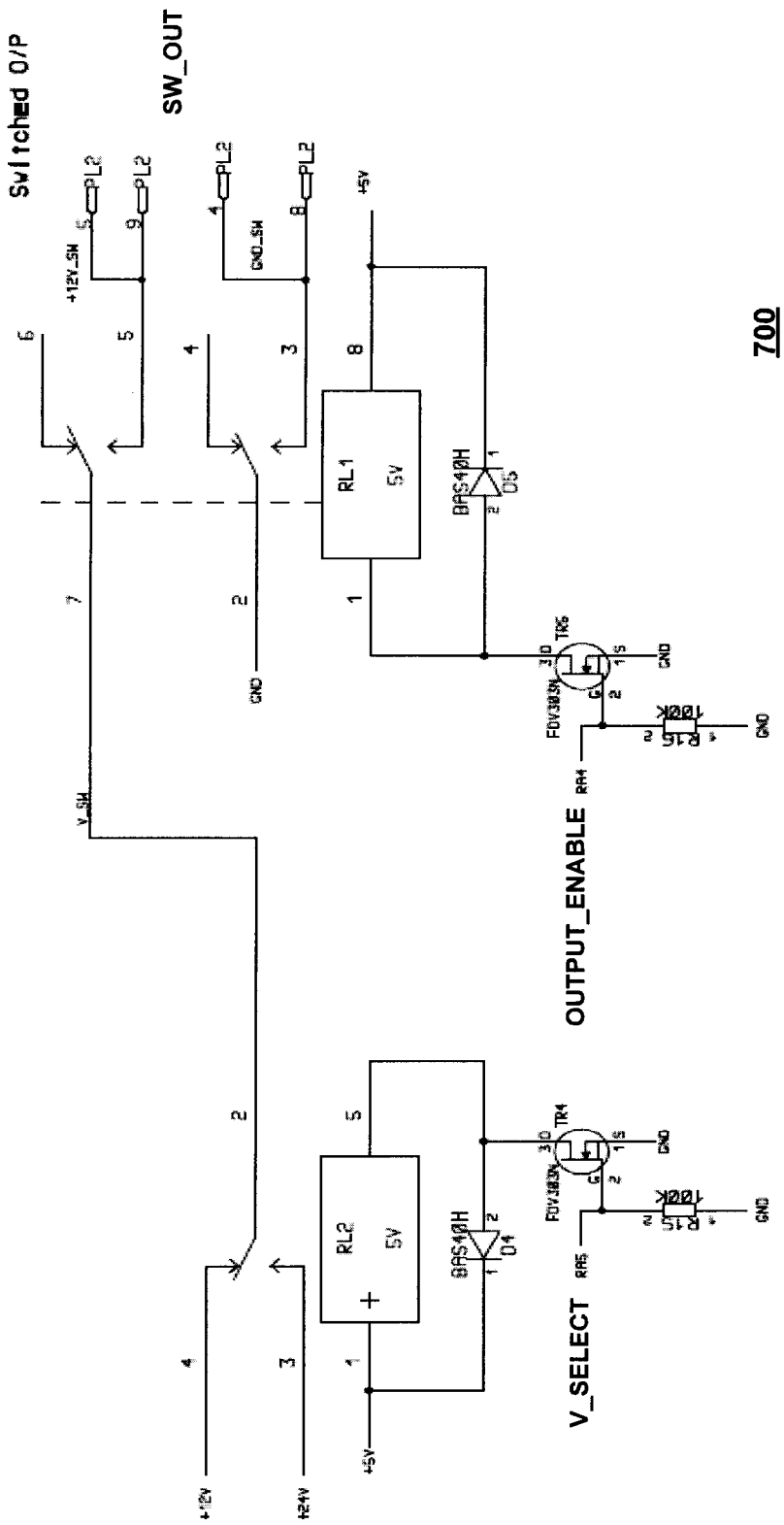
FIG. 7 is a schematic diagram of switched output circuitry of the UPV module of FIG. 2, in accordance with an embodiment of the present invention.

FIG. 7 is a detailed schematic of the switched output circuitry 700. When UPV module 100 is in operation mode and a voltage at MUX_IN matches a stored voltage, processor 200 may trigger switched output circuitry 700, to operate the electrical component 2000. Conversely when the voltage at MUX_IN does not match the stored voltage range the output SW_OUT to electrical component may be disabled. Two signals provided by processor 200 control switched output circuitry 700. The signal V_SELECT selects whether switched output circuitry uses 12V or 24V as SW_OUT to enable electrical component 2000. The choice of 12V or 24V is determined based on the detected voltage of the power supply or battery voltage, provided by power conditioning circuitry as V_MEAS as described earlier. Processor 200 uses the latched output LATA5, provided on voltage select pin RA5 to provide V_SELECT to switched output circuitry 700. For example, if V_SELECT is 0 then switched output circuitry 700 may use 12V as SW_OUT, and if V_SELECT is 1 then switched output circuitry may use 24V as SW_OUT provided to the electrical component 2000. Processor 200 uses the latched output LATA4, provided on pin RA4, to provide output enable signal OUTPUT_ENABLE to switched output circuitry 700. To enable electrical component 2000 the output enable signal OUTPUT_ENABLE is asserted by processor 200 by setting the latched output bit LATA4, provided on output enable pin RA4, to high, or logic level "1". The advantage of using latched outputs is that the status of those signals can be checked by the firmware running on processor 200 as will be seen below. For example, the firmware can detect if OUTPUT_ENABLE is high and accordingly if it needs to assert or de-assert it depending on the situation. In the shown embodiment, voltage select pin RA5 (V_SELECT) controls the relay RL2 which selects between +12V and +24V. Similarly, output enable pin RA4 (OUTPUT_ENABLE) controls output enable relay RL1 which switches the output between the value set by voltage select relay RL2 (12V or 24V) of an output voltage selector circuit, and GND thus either enabling the electrical component 2000 or disabling it.

Figure 9:
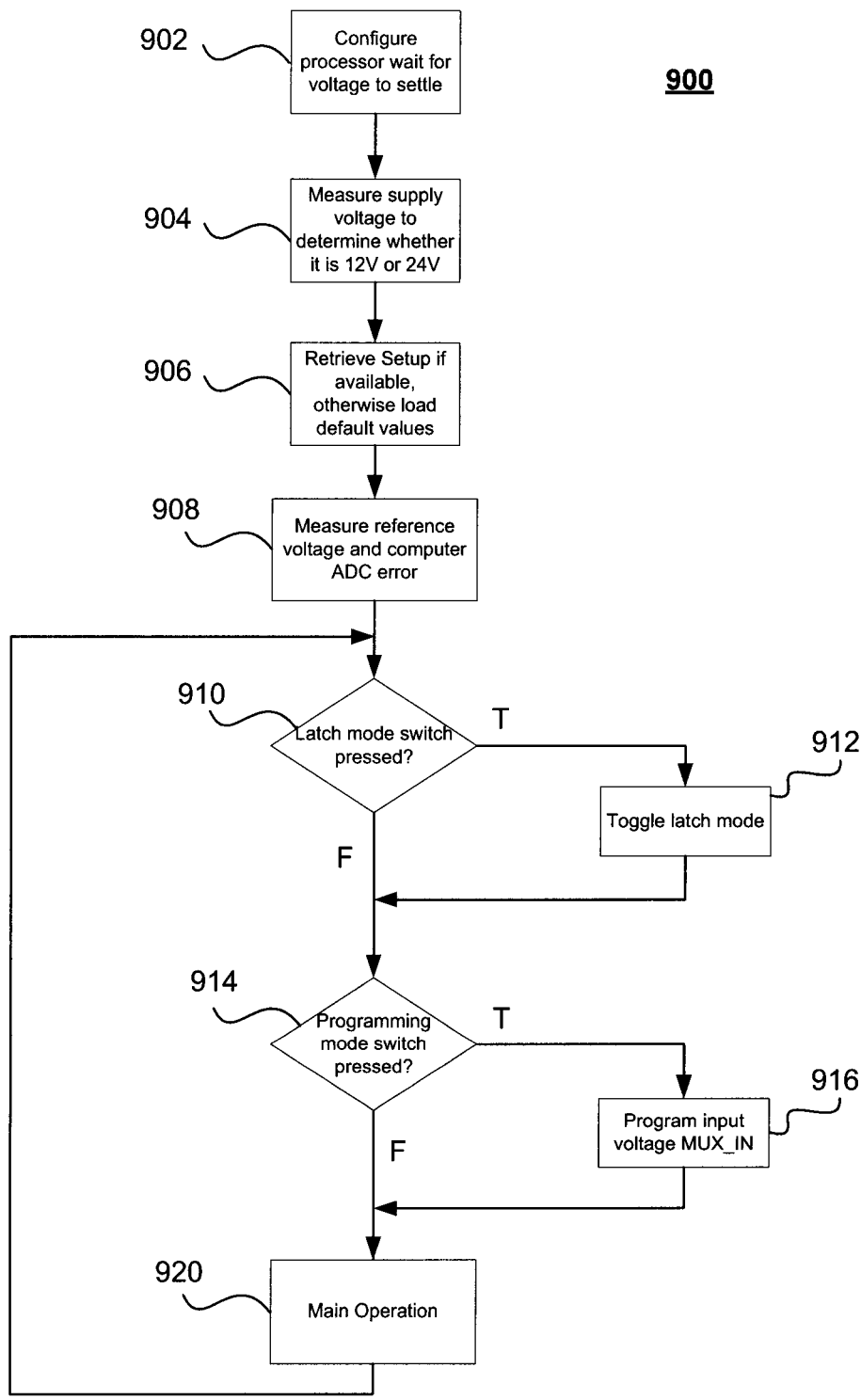
FIG. 9 is a flow chart of the main function of the firmware of the UPV module of FIG. 2 executed on the processor of FIG. 3, in accordance with an embodiment of the present invention.

Turning now to FIG. 9 which describes at a high level the operation of the firmware, as method 900, executed by processor 200 to perform the functionality required by the UPV module 100. Method 900 starts at step 902 wherein the processor 200 is configured. The configuration of processor 200 includes, but is not limited to: selecting operating frequency, defining the various port pins as either input or output, configuring any timers if any, and configuring the built-in ADC. After the processor 200 is configured, a delay function is executed to ensure the voltages in the system have settled and are stable. At step 904, the supply voltage is measured to determine whether the supply battery is a 12V battery or a 24V battery. As mentioned, this is done via the signal V_MEAS which is applied to AN6/RC2. A comparison is made between the supply voltage and 18V. If the supply voltage is greater than 18V then the battery is a 24V battery, otherwise the battery is a 12V battery.

At step 906, the non-volatile memory is checked for a previously stored setup for the UPV module. A setup comprises three components: a minimum threshold voltage, a maximum threshold voltage, and a latch/momentary mode flag. The minimum and maximum threshold voltage values represent the range within which a detected voltage is considered to match a preprogrammed one. For example, if it is required to detect a 5.4V signal, the minimum threshold may be 5.3V and the maximum threshold may be 5.5V. More details are provided below on how programming a voltage is done. The other parameter that is stored is one that determines whether the system is operating in latch mode or momentary mode. The setup parameters are read from specific locations in the non-volatile memory. A sanity check is made to ensure the values are legitimate. For example, upon writing a setup certain magic bytes such as 0x55 and 0xAA are written along with the data at specific locations. If upon checking the non-volatile storage, the magic values are not there, the firmware determines that no prior setup was stored in the non-volatile memory and instead loads default values for the minimum and maximum voltage thresholds and for the latch mode.

At step 908, the reference voltage for the ADC, provided to analog channel 5 (AN5) is measured. The reference voltage is expected to be 4.096V. A comparison is made between that value and the actual measured value, and an error difference ratio is computed. This error is later used to compensate for errors in other ADC readings such as the battery voltage V_MEAS or the MUX_IN voltage.

After step 908, the firmware enters into an infinite loop where it performs three tasks sequentially. 1) check if latch mode button is pressed (step 910) and if so toggle the latch mode flag (step 912), 2) check if the program button is pressed (step 914) and if so enter program mode to program the sensed voltage (MUX_IN) into the system by storing it into non-volatile memory (step 916), and 3) Run the main operation procedure (step 920) in which the sensed voltage MUX_IN is compared with a pre-programmed voltage range of minimum and maximum voltage thresholds, and in which action is taken upon a match to activate electrical component 2000. A description of the various steps 912, 916 and 920 is provided below with reference to FIGS. 10 to 14.

Figure 10:
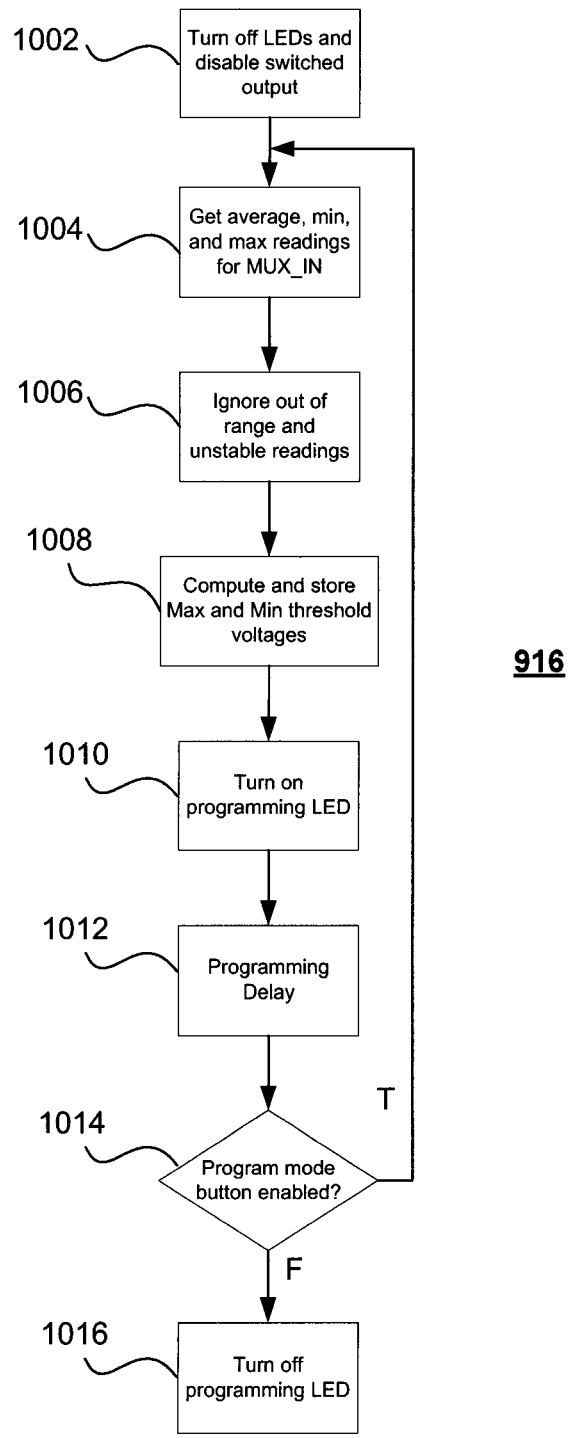
FIG. 10 is a flow chart of the programming function which is part of the firmware of the UPV module of FIG. 2 executed on the processor of FIG. 3, in accordance with an embodiment of the present invention.

FIG. 10 details the programming steps of the program operation of step 916. At step 1002, the output SW_OUT is disabled by de-asserting OUTPUT_ENABLE. In addition both the program and operation LEDs are turned off. The processor 200 then executes a loop in which the steps 1004 to 1012 are carried out while the program button SW2 is pressed. At step 1004 a number of readings of the signal MUX_IN are carried out over ADC channel AN2. In one embodiment 100 readings are carried out by the ADC. The average, minimum, and maximum readings are obtained. At step 1006, invalid readings are excluded or skipped. For example an average reading that is less than 0.2V or higher than 11.9V is excluded. In this case the expectation is that the voltage provided by the device module 2002 is in that range. In addition, and to ensure that the MUX_IN voltage to be programmed is stable, a reading in which the difference between the minimum and the maximum value is larger than 0.2V is also excluded. At step 1008, the minimum voltage threshold and the maximum voltage threshold are calculated and stored in non-volatile memory. For a precise detection of a voltage, the minimum voltage threshold is the average measured voltage of MUX_IN minus 0.1 volts. Similarly, the maximum voltage threshold is the average measured voltage of MUX_IN plus 0.1 volts. At step 1010 the "program" LED (LD1) is turned on, and then at step 1012 a delay takes place to allow for the voltage threshold values to be stored in non-volatile memory. At step 1014 processor 200 checks the status of the program switch (SW2) by reading the status of pin RC5. If the program switch is still depressed, then the above steps are repeated. Otherwise the programming procedure exits turning the LED off in step 1016 before it terminates.

In other implementations, a device may produce a range of voltages which all need to be detected. For example, a device may be producing voltages in the range of 4V to 8V. In this case, an average voltage of 6V may be chosen and a difference of 2V may be added and subtracted to the average voltage to arrive at the minimum and maximum voltage thresholds. The minimum voltage threshold would be 6V−2V=4V, and the maximum voltage threshold would be 6V+2V=8V. The determination of the minimum and threshold ranges may vary with the application for which the UPV module will be deployed. In one embodiment multiple "program" switches may be provided. For example, a "minimum" voltage program switch may be provided. When the minimum voltage switch is pressed, the detected voltage MUX_IN is stored as the minimum threshold voltage. Similarly, a "maximum" program switch may also be provided. When the maximum voltage switch is pressed, the detected voltage MUX_IN is stored as the maximum threshold voltage. Accordingly, the UPV module may be operated to detect a single voltage or a range of voltages without having to recompile and reload the firmware to processor 200.

With respect to step 912, the steps of toggling between momentary and latch modes are described in more detail with reference to FIG. 11. If the latch toggle button SW1 is pressed, detected by a logic level "0" on input pin RC6 of processor 200, and the firmware executes the steps starting at 1102. At 1104, the firmware loops waiting for SW1 to be released. A global latch flag is maintained as to whether the system is in momentary mode or latched mode. The global latch flag is tested at 1106. If the latch flag is set, then it is cleared (step 1112) and LD3 is turned off (step 1114) indicating that the system is in momentary mode. Conversely, if the latch flag is clear, then it is set (step 1108) and LD3 is turned on (step 1110) indicating that the system is in latched mode. The process terminates at 1120.

It should be noted that the firmware executes a debouncing procedure that waits until the latch toggle button SW1 is released, i.e. when the voltage on RC6 returns to 5V or logic level "1". For greater certainty and to ensure the button has been released a delay is executed and the status of SW1 is checked once more. If the status of SW1 is read as being pressed, the debouncing procedure loops back, rechecks SW1 and executes a delay. Two successive readings of logic level "1" separated in time by a delay are necessary to ensure the button has been properly released by the user. In one embodiment the delay used in debouncing is 5 milliseconds but other values are also contemplated.

With respect to step 920 which is the main operation process, it is described at a high level with reference to FIG. 12. The process starts at 1202. At 1204 the multiplexed input voltage MUX_IN is read. As detailed above, the signal is first scaled down as V_IN and read. The value of the signal MUX_IN is then determined by scaling it up after it has been converted by the ADC on processor 200. Subsequent to reading the input voltage, the firmware checks the latch flag (step 1206) to determine whether the system is operating in momentary mode or latched mode. If the latch flag is set, then momentary mode 1210 is entered. Alternatively, if the latch flag is clear, then latch mode 1208 is entered.

Momentary mode operation (step 1210 of FIG. 12) is described with reference to FIG. 13. The operation starts at 1302. At 1304, the input voltage is compared with the range stored by processor 200. If the input voltage is in range, the OUTPUT_ENABLE signal is checked to see if the output is already enabled. If the output is already enabled, the process terminates at 1350. If, however, the output was not enabled the firmware executes a short delay, such as 10 ms or 100 ms (step 1308). The input voltage MUX_IN is read again (step 1310). If the input voltage MUX_IN is not in range, the process terminates at 1350. If the input voltage is within the stored range, then OUTPUT_ENABLE is asserted (step 1314), and LD2 is turned on (1316) to indicate that the input voltage is in range and accordingly output is enabled for the electrical component. The process terminates at 1315.

Alternatively, if at 1304, the input voltage is determined not to be in range of the stored voltage range, step 1320 is executed. At 1320 the output is checked to see if it is enabled. If OUTPUT_ENABLE is low (not asserted), then the process terminates at 1350. Otherwise at 1322 a delay is performed, and at 1324 the input voltage is read again. If the value is determined to be in range at 1326, then the process terminates at 1350. The repeated reading of the input voltage twice separated by a delay ensures that the signal is stable. This also applies to steps 1308 and 1310 above. At 1326 if the input voltage is determined not to be in range, then at 1328 the output is disabled by de-asserting OUTPUT_ENABLE and LD2 is turned off (step 1330) to indicate that the input voltage is not in range and accordingly output to the electrical component is disabled.

Figure 13:
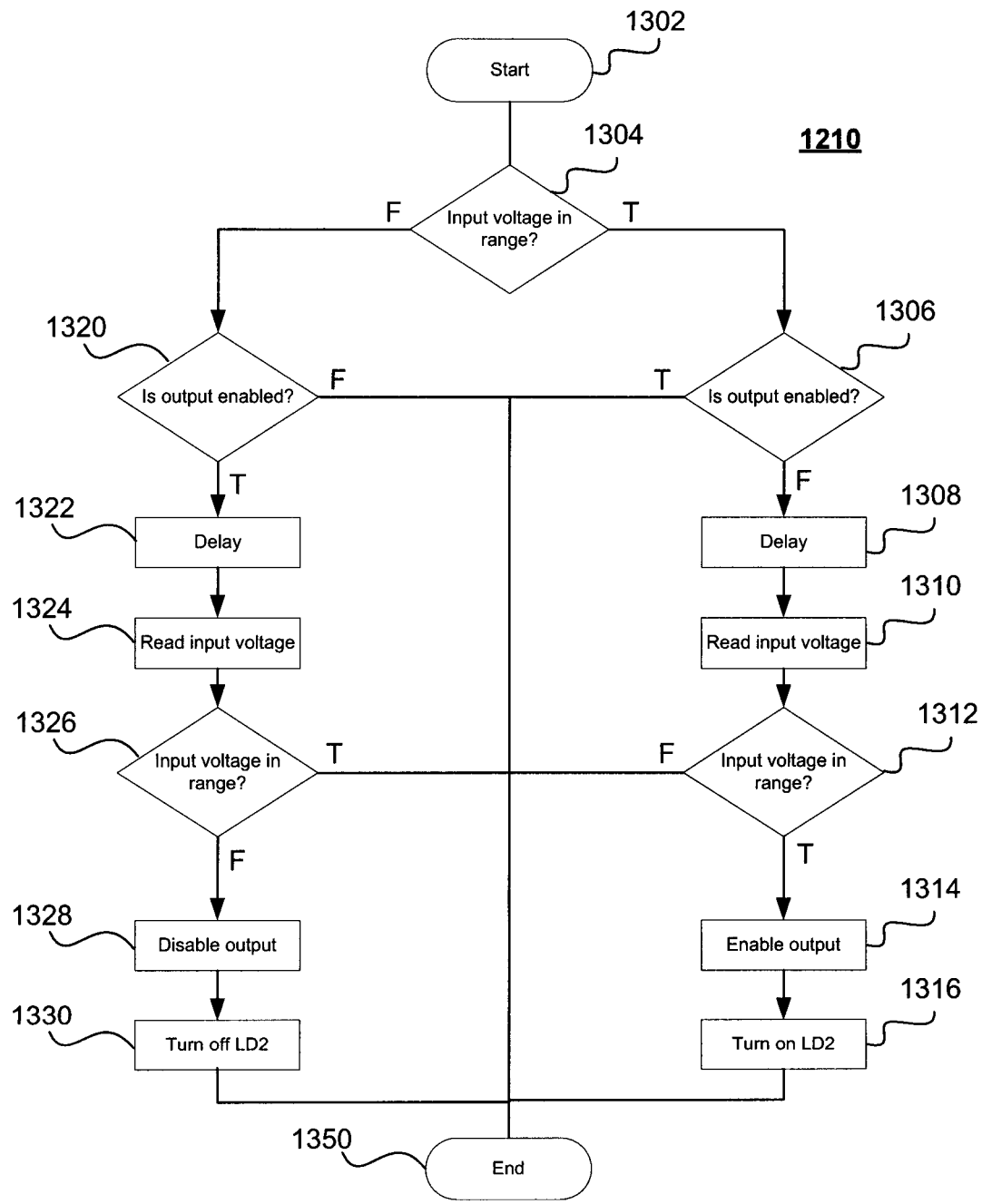
FIG. 13 is a flow chart of a momentary mode of operation of the UPV module of FIG. 2 which is part of the firmware executed on the processor of FIG. 3, in accordance with an embodiment of the present invention.

As can be appreciated from the steps of FIG. 13, in momentary mode the UPV module reacts to any changes in the input signal MUX_IN. In other words, the output is enabled as long as MUX_IN matches a stored voltage range, and is disabled as soon as MUX_IN is outside the stored voltage range.

Figure 14:
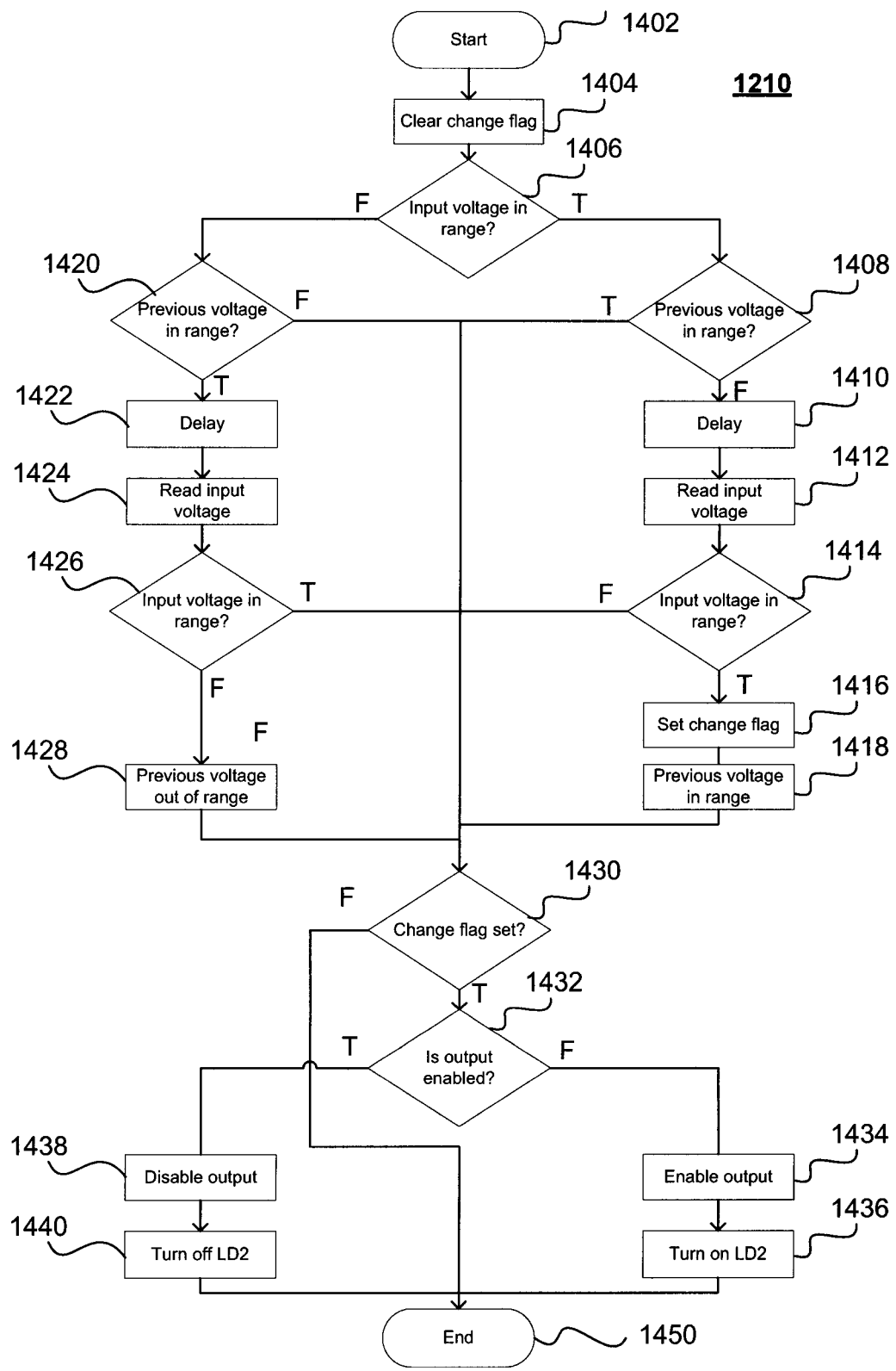
FIG. 14 is a flow chart of a latched mode of operation of the UPV module of FIG. 2 which is part of the firmware executed on the processor of FIG. 3, in accordance with an embodiment of the present invention.

FIG. 14 details the steps of latched mode (step 1208 of FIG. 12). The steps of latch mode start at 1402. At 1404 a change flag is cleared. The input voltage MUX_IN is checked as to whether it is in the range of the minimum voltage threshold and maximum voltage threshold (step 1406). If the voltage is in range, at step 1408 the firmware checks if the previous voltage was in range, and if so the process skips to step 1430 without setting the change flag. Accordingly the process terminates by going to step 1450.

Returning back to step 1408, if the previous voltage was not in range, then that a delay is executed (step 1410) and the input voltage MUX_IN is read again (step 1412). If MUX_IN is not in range (step 1414), then input voltage is not stable or changing and again the process skips to step 1430 then step 1450. However, if at step 1414 the input voltage MUX_IN is in range, then the change flag is set (step 1416) and the previous voltage is set to the current voltage MUX_IN (step 1418). At step 1430 the change flag is set and at step 1432 the status of the OUTPUT_ENABLE is checked, and the output is toggled. For example, if the output was not enabled already, it is enabled (step 1434) and LD2 is turned on (step 1436). Conversely, if the output was already enabled, it is disabled (step 1438) and LD2 is turned off (step 1440).

The above steps show that a transition from out-of-range to in-range on the input voltage MUX_IN causes the output to the electrical component to be toggled. A first transition from out-of-range to in-range would cause the output to be enabled. A second transition from out-of-range to in-range would cause the output to be disabled.

If at step 1406 the input voltage MUX_IN was not in range of a stored maximum and minimum voltage thresholds, the previous voltage is checked (step 1420). If the previous reading was also out of range the process skips to step 1430 then 1450 (since the change flag is clear). Otherwise, a delay is executed (step 1422) and the input voltage is read again (step 1424) for confirmation. If the input voltage is in range, then the input is transitioning or not stable. The firmware skips to step 1430 then step 1450. If, however, the second input voltage reading is also out of range, the previous voltage is updated with that out of range value. The process drops to step 1430 then step 1450.

The above steps 1420-1428 show that the status of the output in latched mode does not change when the input voltage MUX_IN becomes out-of-range of the stored minimum and maximum voltage thresholds.

Accordingly, latched mode only provides a toggle of the output with every transition from out-of-range MUX_IN to in-range MUX_IN voltages.

Although the embodiments described herein demonstrate only a single voltage trigger, other embodiments contemplate programming multiple different voltage triggers. For example, the programming switch may be used multiple times to store multiple input voltages to be monitored. In this case, an additional switch may be provided to clear the programmed voltages. For example, a user may program 3 voltages to be monitored by providing a first voltage on the MUX_IN input, then pressing the programming switch, providing a second voltage on the MUX_IN input, then pressing the programming switch, and finally providing a third voltage on the MUX_IN input and pressing the programming switch. All 3 voltages are then stored in the non-volatile memory as individual ranges each having a minimum and a maximum voltage threshold. In normal operation, the firmware compares a voltage on the MUX_IN pin with each of the 3 stored voltage ranges. If the input voltage matches any of the stored 3 ranges, then the output is asserted via the OUTPUT_ENABLE signal.

Although a single multiplexed input signal MUX_IN is shown, in other embodiments two or more multiplexed input signal may be used. In this case multiple instances of the MUX input circuitry 400 may be provided, one for each MUX_IN signal. Additionally the processor may have additional ADC channels, one for each V_IN signal provided by each MUX input circuitry 400. During programming the firmware associates each MUX_IN signal with the voltage range corresponding to it, and stores that information in the non-volatile memory. During operation, the firmware can process the inputs on the various analog inputs in a round-robin manner and determines the input voltage for each V_IN signal. The firmware may be pre-configured to assert the output signal OUTPUT_ENABLE if any or all of the MUX_IN signals have a voltage that matches a pre-programmed voltage range for the corresponding MUX_IN input signal. Alternatively, the firmware may be configurable at run-time by means of a configurable switch such as a dual inline package (DIP) switch, a rotary switch or any other configurable switch. For example, if a DIP switch is used, in one setting of the DIP switch the output signal OUTPUT_ENABLE is asserted if only a first input MUX_IN signal falls within a pre-programmed voltage range corresponding to that first input. In another setting of the DIP switch, the output signal OUTPUT_ENABLE is asserted if only a second input signal falls within a pre-programmed voltage range corresponding to that second input. In yet another setting of the DIP switch, the output signal OUTPUT_ENABLE is asserted only if both the first and second input signals fall within a pre-programmed voltage range. Other possible scenarios would be apparent to those of skill in the art.

In addition, although a single OUTPUT_ENABLE signal, and a single V_SELECT are shown, multiple instances of each signal may be present. For example, a first analog voltage may trigger a first OUTPUT_ENABLE signal connected to a first switched output circuitry 700, and a second analog voltage may trigger a second OUTPUT_ENABLE signal connected to a second switched output circuitry 700. Similarly, both the first and second output circuitry 700 may be configured to either output a 12V or a 24V based on a respective first V_SELECT and a second V_SELECT signal. As mentioned above, a DIP switch may be used to configure the firmware to support multiple multiplexed input signals, and the DIP switch may also be used to configure the firmware to support the multiple output signals. For example, assuming two input multiplexed signals MUX_IN1 and MUX_IN2 (not shown), and two output enable signals OUTPUT_ENABLE1 and OUTPUT_ENABLE2, a DIP switch may provide the firmware with different operating scenarios. For example, in one scenario, OUTPUT_ENABLE1 is asserted when MUX_IN1 is in a pre-programmed voltage range, and OUTPUT_ENABLE2 is asserted when MUX_IN2 is in a pre-programmed voltage range. Alternatively, the DIP switch may be configured such that both OUTPUT_ENABLE1 and OUTPUT_ENABLE2 are asserted if only MUX_IN2 is in a pre-programmed voltage range. In another example, the DIP switch may be configured such that OUTPUT_ENABLE1 is asserted if both MUX_IN1 and MUX_IN2 are in a pre-programmed voltage range. Other combinations, number of inputs, and number of outputs are also contemplated.

The embodiments described herein demonstrate a temporary voltage change on the input elicits a change in output. In some embodiments, the temporary voltage change may be on the order of at least one of microseconds, milliseconds, seconds, or minutes.

Other embodiments may also not have a latched/momentary switch and the functionality may be fixed in a latched mode or a momentary mode. In another embodiment, the only switch may be the program switch with the functionality fixed in a latched mode or a momentary mode, or any combination thereof.

Some embodiments describe memory storing information within the processor 200. In other implementations, the memory is a volatile memory unit or units. In another implementation, the memory is a non-volatile memory unit or units. The memory may also be another form of computer-readable medium, such as a magnetic or optical disk.

The memory may be implemented as one or more of a computer-readable medium or media, a volatile memory unit or units, or a non-volatile memory unit or units. Expansion memory may also be provided and connected to device through expansion interface, which may include, for example, a SIMM (Single In Line Memory Module) card interface. Such expansion memory may provide extra storage space for device, or may also store applications or other information for device. Specifically, expansion memory may include instructions to carry out or supplement the processes described above, and may include secure information also.

Thus, for example, expansion memory may be provided as a security module for device, and may be programmed with instructions that permit secure use of device. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory, expansion memory, memory on processor, or a propagated signal that may be received, for example, over transceiver or external interface.

The processor 200 may additionally comprise an input/output device such as a display, a communication interface, and a transceiver, among other components.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

Although specific components are described herein, alternative components with similar structure and operation as known to those of skill in the art may replace these components.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A universal programmable voltage module, comprising:
   a processor having non-volatile memory including computer instructions, an analog to digital converter, a plurality of input pins, and a plurality of output pins, the processor capable of executing the computer instructions for:

reading at least one input analog voltage from at least one detected voltage pin of the plurality of input pins, configured as an analog pin;

converting the at least one input analog voltage to at least one voltage value;

comparing the at least one converted voltage value with at least one stored voltage value range;

if the at least one input analog voltage is within the at least one stored voltage value range, asserting at least one output enable pin from the plurality of output pins for activating an electrical component, further comprising a power conditioning circuit for providing a plurality of supply voltages from a direct current power source, wherein the power conditioning circuit comprises a voltage measuring output for providing an indication of the voltage of the direct current power source, and wherein the voltage measuring output is connected to a power source voltage detection input pin, configured as an analog pin.

2. The universal programmable voltage module according to claim 1, further comprising at least one voltage select pin from the plurality of output pins.

3. The universal programmable voltage module according to claim 1, further comprising at least one multiplex input circuit for receiving at least one multiplexed analog voltage and scaling it down for providing the at least one input analog voltage.

4. The universal programmable voltage module according to claim 3, wherein the at least one multiplex input circuit comprises a buffer and a resistor divider and wherein the at least one input analog voltage is provided as an output from a midpoint of the resistor divider.

5. The universal programmable voltage module according to claim 1, further comprising a first switch coupled to a first one of the plurality of input pins, the first switch for enabling a programming mode on the universal programmable voltage module.

6. The universal programmable voltage module according to claim 5, further comprising a second switch coupled to a second one of the plurality of input pins, the second switch for toggling an operating mode of the universal programmable voltage module between a momentary mode and a latched mode.

7. The universal programmable voltage module according to claim 1, further comprising at least one light emitting diode (LED) circuit operatively connected to at least one of the plurality of output pins for indicating an operation mode of the universal programmable voltage module, wherein the at least one LED circuit comprises first LED circuit for indicating that the input analog voltage is within the stored voltage value range, a second LED circuit for indicating an operating mode, and a third LED circuit for indicating a programming mode, wherein the operating mode is one of: a latched mode and a momentary mode.

8. The universal programmable voltage module according to claim 1, wherein:
the at least one input analog voltage comprises a single input analog voltage;
the at least one detected voltage pin comprises a single detected voltage pin;
the at least one voltage value comprises a single voltage value;
the at least one stored voltage value range comprises a single voltage value range; and
the at least one output enable pin comprises a single output enable pin.

9. The universal programmable voltage module according to claim 1, wherein:

the at least one input analog voltage comprises a first input analog voltage and a second input analog voltage;
the at least one detected voltage pin comprises a first detected voltage pin and a second detected voltage pin;
the at least one voltage value comprises a first voltage value and a second voltage value;
the at least one stored voltage value range comprises a first voltage value range and a second voltage value range;
comparing the at least one converted voltage value with at least one stored voltage value range comprises comparing the first voltage value with the first voltage range and comparing the second voltage value with the second voltage range; and asserting the at least one output enable pin comprises asserting a first output enable pin and a second output enable pin.

10. The universal programmable voltage module according to claim 9, wherein asserting the first output enable pin and the second output enable pin is based on a configurable switch setting.

11. The universal programmable voltage module according to claim 1, wherein:
the at least one input analog voltage comprises a plurality of input analog voltages;
the at least one detected voltage pin comprises a plurality of detected voltage pins;
the at least one voltage value comprises a plurality of voltage values;
the at least one stored voltage value range comprises a plurality of voltage value ranges;
comparing the at least one converted voltage value with at least one stored voltage value range comprises comparing the plurality of voltage values with the plurality of voltage ranges; and
asserting the at least one output enable pin comprises asserting a plurality of output enable pins.

12. The universal programmable voltage module according to claim 11, wherein asserting the plurality of output enable pins is based on a configurable switch setting.

13. The universal programmable voltage module according to claim 12, wherein the configurable switch is a dual in-line package (DIP) switch.

14. A telematic device comprising the universal programmable voltage module according to claim 1.

15. A universal programmable voltage module, comprising:
a processor having non-volatile memory including computer instructions, an analog to digital converter, a plurality of input pins, and a plurality of output pins, the processor capable of executing the computer instructions for:
reading at least one input analog voltage from at least one detected voltage pin of the plurality of input pins, configured as an analog pin;
converting the at least one input analog voltage to at least one voltage value;
comparing the at least one converted voltage value with at least one stored voltage value range;
if the at least one input analog voltage is within the at least one stored voltage value range, asserting at least one output enable pin from the plurality of output pins for activating an electrical component, further comprising at least one switched output circuit for receiving an output enable signal from the at least one output enable pin, wherein the at least one output enable signal is applied to an output enable relay that enables a power source voltage to activate the electrical component, further comprising at least one output voltage selector circuit for receiving a voltage select signal from the at least one voltage select pin, wherein the voltage select signal is applied to a voltage select relay that enables selecting a power source voltage to activate the electrical component.

16. A method of operating a universal programmable voltage module, comprising:
    detecting whether the universal programmable voltage module is in a programming mode or in an operation mode;
    reading an analog input voltage from a detected voltage pin;
    converting the analog input voltage to a voltage value;
    if the universal programmable voltage module is in programming mode then:
    generating a voltage range comprising a minimum voltage threshold and a maximum voltage threshold based on the converted voltage value;
    storing the voltage range in a non-volatile memory; and
    if the universal programmable voltage module is in operation mode then:
retrieving the minimum voltage threshold and the maximum voltage threshold from the non-volatile memory;
    if the converted voltage value is greater than the minimum voltage threshold and smaller than the maximum voltage threshold then asserting an output enable pin for enabling an electrical component.

17. The method according to claim 16, wherein asserting the output enable pin is performed only if the output enable pin was not already asserted.

18. The method according to claim 16, further comprising: if the converted voltage value is less than the minimum voltage threshold or greater than the maximum voltage threshold then de-asserting the output enable pin for disabling the electrical component, wherein de-asserting the output enable pin is performed only if the output enable pin was not already de-asserted.

19. A method of operating a universal programmable voltage module, comprising:
    detecting whether the universal programmable voltage module is in a programming mode or in an operation mode;
    reading an analog input voltage from a detected voltage pin;
    converting the analog input voltage to a voltage value;
    if the universal programmable voltage module is in programming mode then;
    generating a voltage range comprising a minimum voltage threshold and a maximum voltage threshold based on the converted voltage value;
    storing the voltage range in a non-volatile memory; and
    if the universal programmable voltage module is in operation mode then:
retrieving the minimum voltage threshold and the maximum voltage threshold from the non-volatile memory;
    if the converted voltage value is greater than the minimum voltage threshold and smaller than the maximum voltage threshold and a previous converted voltage value is less than the minimum voltage threshold or greater than the maximum voltage threshold then asserting an output enable pin if the output pin was de-asserted, and de-assert the output enable pin if the output enable pin was asserted.

* * * * *